(12) United States Patent
Shi (10) Patent No.: US 11,878,458 B2
(45) Date of Patent: Jan. 23, 2024

(54) AIRBAG ASSEMBLY AND METHOD FOR BENDING A FLEXIBLE PANEL USING SAME

(71) Applicant: Wuhan China Star Optoelectronics Semiconductor Display Technology Co., Ltd., Hubei (CN)

(72) Inventor: Youshui Shi, Hubei (CN)

(73) Assignee: Wuhan China Star Optoelectronics Semiconductor Display Technology Co., Ltd., Hubei (CN)

( * ) Notice: Subject to any disclaimer, the term of this patent is extended or adjusted under 35 U.S.C. 154(b) by 1146 days.

(21) Appl. No.: 16/603,093

(22) PCT Filed: Jan. 15, 2019

(86) PCT No.: PCT/CN2019/071683
§ 371 (c)(1),
(2) Date: Oct. 4, 2019

(87) PCT Pub. No.: WO2020/118840
PCT Pub. Date: Jun. 18, 2020

(65) Prior Publication Data
US 2021/0358864 A1   Nov. 18, 2021

(30) Foreign Application Priority Data
Dec. 15, 2018 (CN) .......................... 201811537111.0

(51) Int. Cl.
*B29C 53/04* (2006.01)
*G09F 9/30* (2006.01)
(Continued)

(52) U.S. Cl.
CPC ............ *B29C 53/04* (2013.01); *B29C 53/025* (2013.01); *B29C 53/82* (2013.01); *G09F 9/301* (2013.01);
(Continued)

(58) Field of Classification Search
CPC ... B29C 53/025; B29C 33/405; B29C 33/505; B29C 51/28; B29D 30/0654
See application file for complete search history.

(56) References Cited

U.S. PATENT DOCUMENTS 4,047,870 A * 9/1977 Smaldone ............... B29C 51/28
425/389
4,126,659 A * 11/1978 Blad ..................... B29C 53/845
156/80

(Continued)

FOREIGN PATENT DOCUMENTS

| CN | 105009188 A | 10/2015 |
| CN | 105405363 A | 3/2016 |

(Continued)

*Primary Examiner* — Benjamin A Schiffman
(74) *Attorney, Agent, or Firm* — Taft Stettinius & Hollister LLP (57) ABSTRACT

A method for bending a flexible panel includes first, providing an airbag assembly; second, inflating the airbag assembly; next, abutting against the bending area with the airbag assembly; and lastly, bending the flexible panel by pivoting on the airbag assembly so that a bent portion of the flexible panel tightly contacts a surface of the airbag assembly, and the terminal area is located behind the flexible panel. The airbag assembly includes a housing and an elastic film. The housing includes at least one outlet and at least one inlet. The elastic film wraps the housing to form a gas chamber. The outlet and the inlet communicate with the gas chamber.

12 Claims, 5 Drawing Sheets

(51) Int. Cl.
  *B29C 53/02*    (2006.01)
  *B29C 53/82*    (2006.01)
  *G05D 16/20*    (2006.01)
  *B29L 31/34*    (2006.01)
  *B29C 53/34*    (2006.01)
  *B29C 51/28*    (2006.01)
  *B29C 33/40*    (2006.01)
  *B29C 33/50*    (2006.01)

(52) U.S. Cl.
  CPC .......... *B29C 33/405* (2013.01); *B29C 33/505* (2013.01); *B29C 51/28* (2013.01); *B29C 53/043* (2013.01); *B29C 53/34* (2013.01); *B29L 2031/3475* (2013.01); *G05D 16/2013* (2013.01)

(56) References Cited

U.S. PATENT DOCUMENTS

| | | | | |
|---|---|---|---|---|
| 6,533,986 | B1 * | 3/2003 | Fosaaen | B28B 11/003 |
| | | | | 425/389 |
| 8,556,618 | B2 * | 10/2013 | Bergmann | B29C 43/58 |
| | | | | 425/389 |
| 9,349,969 | B2 * | 5/2016 | Kwon | H10K 77/111 |
| 10,074,673 | B2 * | 9/2018 | Choi | H01L 27/1259 |
| 10,111,349 | B2 * | 10/2018 | Xu | H05K 5/0017 |
| 10,343,312 | B2 * | 7/2019 | Kawaguchi | B29D 11/00336 |
| 10,461,273 | B2 * | 10/2019 | Andou | H10K 50/84 |
| 10,756,125 | B2 * | 8/2020 | Jiang | H01L 27/1218 |
| 11,367,860 | B2 * | 6/2022 | Zhang | B29C 33/505 |
| 2005/0276874 | A1 * | 12/2005 | Menaldo | B32B 21/08 |
| | | | | 428/34.1 |
| 2017/0148826 | A1 | 5/2017 | Choi | |
| 2018/0116061 | A1 | 4/2018 | Xu | |

FOREIGN PATENT DOCUMENTS

| | | |
|---|---|---|
| CN | 205177319 U | 4/2016 |
| CN | 106205396 A | 12/2016 |
| CN | 107067978 A | 8/2017 |
| CN | 107316568 A | 11/2017 |
| CN | 107481622 A | 12/2017 |
| CN | 107680490 A | 2/2018 |
| CN | 108364602 A | 8/2018 |
| CN | 108615464 A | 10/2018 |
| CN | 108615466 A | 10/2018 |
| CN | 108877519 A | 11/2018 |
| CN | 109300401 A | 2/2019 |
| KR | 20180066378 A | 6/2018 |
| WO | 2010082357 A1 | 7/2010 |

* cited by examiner

AIRBAG ASSEMBLY AND METHOD FOR BENDING A FLEXIBLE PANEL USING SAME

CROSS-REFERENCE TO RELATED APPLICATIONS

This application is a U.S. National Phase of International PCT Application No. PCT/CN2019/071683 filed Jan. 15, 2019, which claims the benefit of Chinese Patent Application Serial No. 201811537111.0 filed Dec. 15, 2018, the contents of each application are incorporated herein by reference in their entirety.

BACKGROUND OF DISCLOSURE

1. Field of Disclosure

The present disclosure relates to the field of bending technology for flexible panels, and more particularly, to an airbag assembly and a method for bending a flexible panel.

2. Description of Related Art

In recent years, there has been an increased interest in full screen display devices. For organic light-emitting diode (OLED) display panels, pad bending technology can realize full screen effects through bending a bonding area of a flexible substrate in which a control chip is bonded to be behind a display panel.

While the bonding area is bent toward the back of the display panel, a bending area appears between the bonding area and a display area. Because a plurality of metal signal lines for transmitting signals are disposed between the bonding area and the display area, while the display panel is bent, the metal signal lines in the bending area are prone to break due to stresses, causing bad signal transmission so that the display panel can not display normally.

Therefore, it is necessary to provide an airbag assembly and a method for bending a flexible panel to solve the above problems.

SUMMARY

A technical problem is that, while a display panel is bent, metal signal lines in a bending area are prone to break due to stresses, causing bad signal transmission so that the display panel can not display normally.

The object of the present disclosure is to provide an airbag assembly and a method for bending a flexible panel, which can avoid that metal signal lines break due to stresses and ensure that the display panel can display normally.

In order to realize the above object, the present disclosure provides an airbag assembly, configured to bend a flexible panel, including: a housing including at least one outlet and at least one inlet; a rubber film wrapping the housing to form a gas chamber, wherein the at least one outlet and the at least one inlet communicate with the gas chamber, wherein the gas chamber is inflated to cause the rubber film to inflate, and wherein the flexible panel is bent to a required curvature through the inflating rubber film; a gas source; a gas pipeline communicating with the gas source and the at least one inlet of the housing; a pressure sensor disposed in the gas pipeline; a pressure-adjusting valve connected to the gas source and the housing through the gas pipeline; and a controller electrically connected to the pressure sensor and the pressure-adjusting valve and configured to receive an output signal from the pressure sensor and to control the pressure-adjusting valve to be turned on and off.

In order to realize the above object, the present disclosure provides an airbag assembly, configured to bend a flexible panel, including: a housing including at least one outlet and at least one inlet; and an elastic film wrapping the housing to form a gas chamber, wherein the at least one outlet and the at least one inlet communicate with the gas chamber, wherein the gas chamber is inflated to cause the elastic film to inflate, and wherein the flexible panel is bent to a required curvature through the inflating elastic film.

In some embodiments, the airbag assembly further includes: a gas source; a gas pipeline communicating with the gas source and the at least one inlet of the housing; a pressure sensor disposed in the gas pipeline; a pressure-adjusting valve connected to the gas source and the housing through the gas pipeline; and a controller electrically connected to the pressure sensor and the pressure-adjusting valve and configured to receive an output signal from the pressure sensor and to control the pressure-adjusting valve to be turned on and off.

In some embodiments, the elastic film is a rubber film.

In order to realize the above object, the present disclosure provides a method for bending a flexible panel including a bending area and a terminal area adjacent to the bending area, the method including: providing an airbag assembly; inflating the airbag assembly; abutting against the bending area with the airbag assembly; and bending the flexible panel by pivoting on the airbag assembly so that a bent portion of the flexible panel tightly contacts a surface of the airbag assembly, and the terminal area is located behind the flexible panel.

In some embodiments, the airbag assembly includes: a housing including at least one outlet and at least one inlet; an elastic film wrapping the housing to form a gas chamber, wherein the at least one outlet and the at least one inlet communicate with the gas chamber; a gas source; a gas pipeline communicating with the gas source and the at least one inlet of the housing; a pressure sensor disposed in the gas pipeline; a pressure-adjusting valve connected to the gas source and the housing through the gas pipeline; and a controller electrically connected to the pressure sensor and the pressure-adjusting valve and configured to receive an output signal from the pressure sensor and to control the pressure-adjusting valve to be turned on and off.

In some embodiments, the step of inflating the airbag assembly includes: controlling, by the controller, the pressure-adjusting valve to be turned on; outputting, by the pressure sensor, a first signal when the pressure inside the gas chamber increases to a predetermined value; and receiving, by the controller, the first signal and controlling, by the controller, the pressure-adjusting valve to be turned off.

In some embodiments, the method further includes causing the airbag assembly to exhaust after the flexible panel is bent.

In some embodiments, the step of causing the airbag assembly to exhaust includes: controlling, by the controller, the pressure-adjusting valve to decompress; outputting, by the pressure sensor, a second signal when the pressure inside the gas chamber decreases to a predetermined value; and receiving, by the controller, the second signal and controlling, by the controller, the pressure-adjusting valve to stop decompressing.

In some embodiments, the flexible panel includes bonding terminals disposed in the terminal area.

In some embodiments, the flexible panel includes a plurality of metal signal lines passing through the bending area.

The beneficial effect of the present disclosure is that, the airbag assembly and the method for bending the flexible panel are provided to avoid that the metal signal lines break due to stresses and to ensure that the display panel can display normally.

BRIEF DESCRIPTION OF DRAWINGS

To ensure the features and the technical content of the disclosure are more apparent and easier to understand, please refer to the explanation and the accompanying drawings of the disclosure as follows. However, the accompanying drawings are merely for reference without limiting the disclosure.

DETAILED DESCRIPTION OF EMBODIMENTS

To ensure the objects, the technical solutions, and the effects of the disclosure are clearer and more specific, the disclosure will be explained in conjunction with the accompanying drawings in detail further below. It should be understood that the embodiments described herein are merely a part of the embodiments of the present disclosure instead of all of the embodiments and not used to limit the disclosure.

Figure 1:
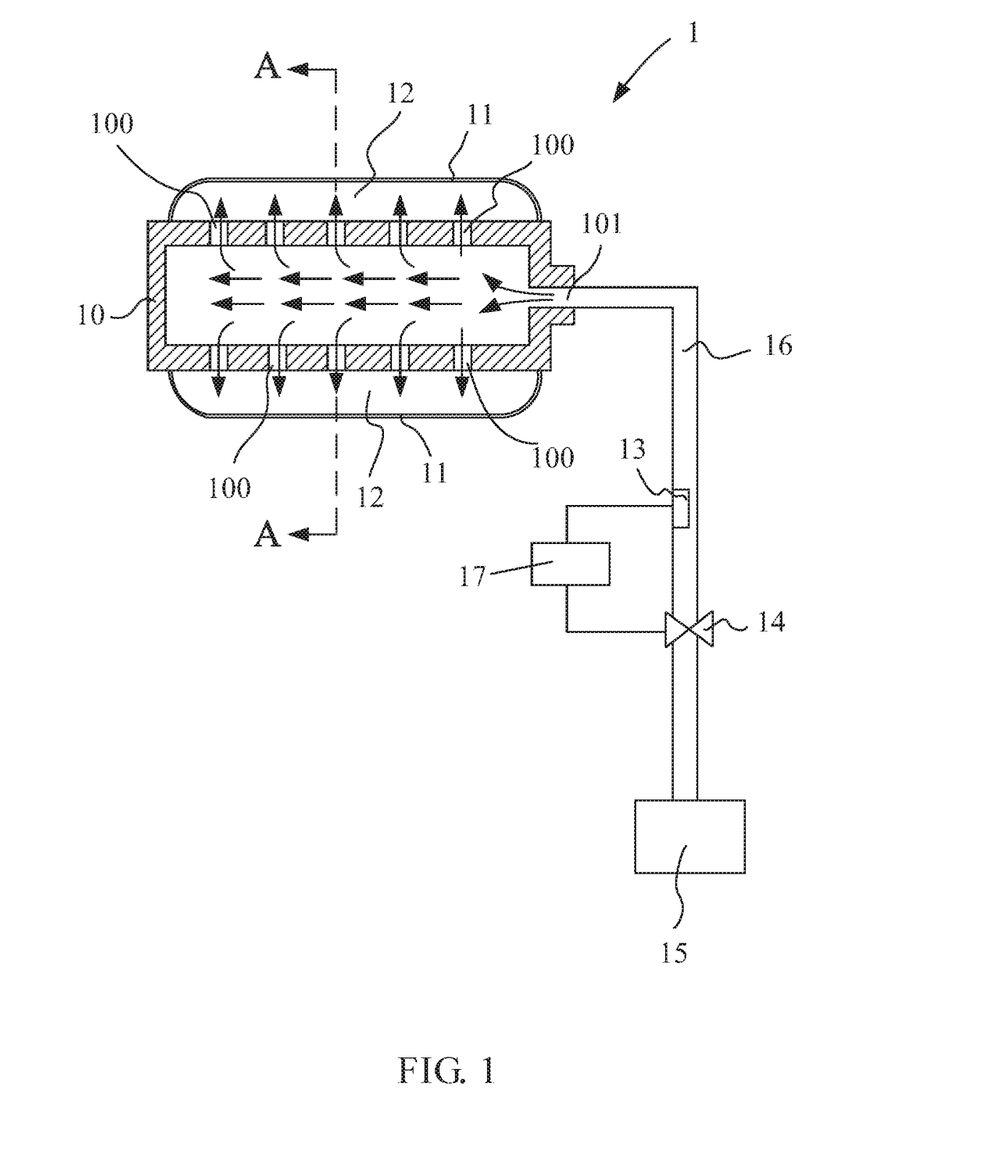
FIG. 1 is a schematic structural diagram of an airbag assembly according to an embodiment of the present disclosure.

Please refer to FIG. 1, which is a schematic structural diagram of an airbag assembly according to an embodiment of the present disclosure. The airbag assembly 1, configured to bend a flexible panel, includes a housing 10 and an elastic film 11. The housing 10 includes at least one outlet 100 and at least one inlet 101. In an embodiment of the present disclosure, the housing 10 includes a plurality of outlets 100 linearly arranged at an equal distance along the longitudinal direction of the housing 10. The elastic film 11 wraps the housing 10 to form a gas chamber 12. The outlet 100 and the inlet 101 communicate with the gas chamber 12. Specifically, the elastic film 11 is a rubber film. In some embodiments, the elastic film 11 adheres to two ends of the housing 10 by using glue in order to form the sealed gas chamber 12. The gas chamber 12 can be inflated to cause the elastic film 11 to inflate, and the flexible panel is bent to a required curvature through the inflating elastic film 11.

As shown in FIG. 1, the airbag assembly 1 further includes a pressure sensor 13, a pressure-adjusting valve 14, a gas source 15, a gas pipeline 16, and a controller 17. The pressure sensor 13 is disposed in the gas pipeline 16. The pressure-adjusting valve 14 is connected to the gas source 15 and the housing 10 through the gas pipeline 16. The gas pipeline 16 communicates with the inlet 101 of the housing 10 and the gas source 15. The controller 17 is electrically connected to the pressure sensor 13 and the pressure-adjusting valve 14 and configured to receive an output signal from the pressure sensor 13 and to control the pressure-adjusting valve 14 to be turned on and off. In some embodiments, the pressure-adjusting valve 14 is an electromagnetic valve. When the pressure-adjusting valve 14 is turned on, the gas source 15 supplies gas to the housing 10 through the gas pipeline 16; when the pressure-adjusting valve 14 is turned off, the gas source 15 fails to supply gas to the housing 10 through the gas pipeline 16. Further, the pressure-adjusting valve 14 can communicate with the outside world in order to cause the airbag assembly 1 to exhaust so that the gas chamber 12 is decompressed.

Figure 2:
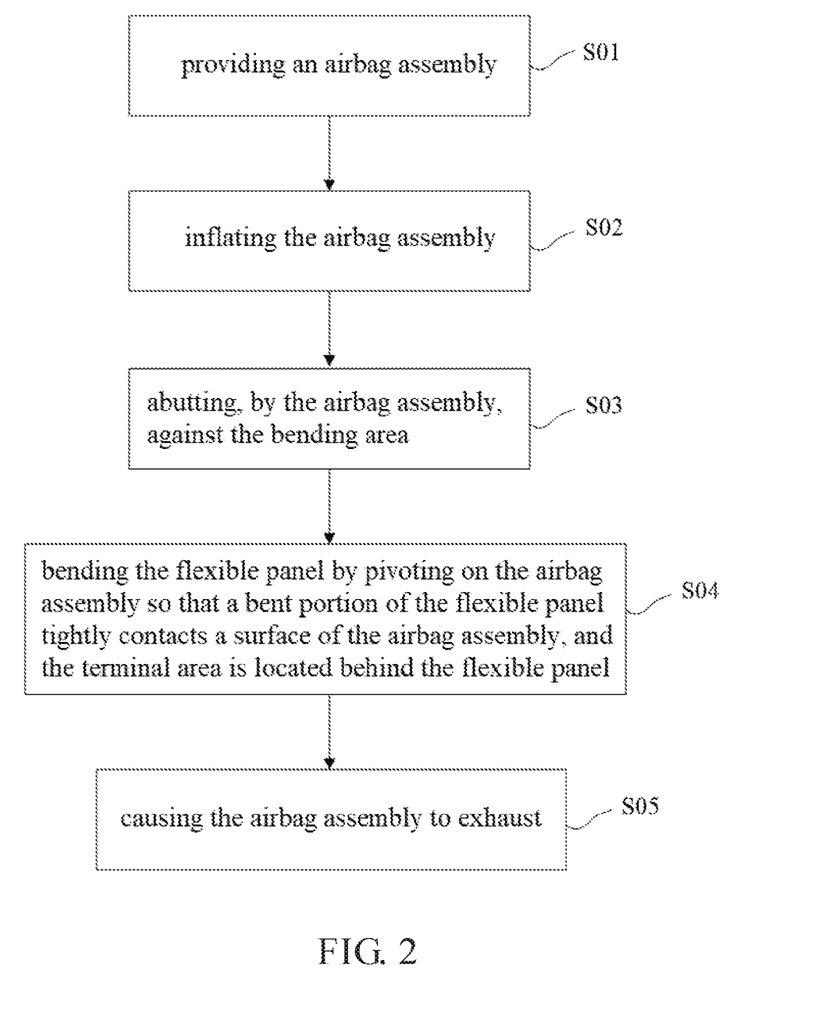
FIG. 2 is a flowchart illustrating a method for bending a flexible panel according to an embodiment of the present disclosure.

Please refer to FIG. 2, which is a flowchart illustrating a method for bending a flexible panel according to an embodiment of the present disclosure.

Figure 3A:
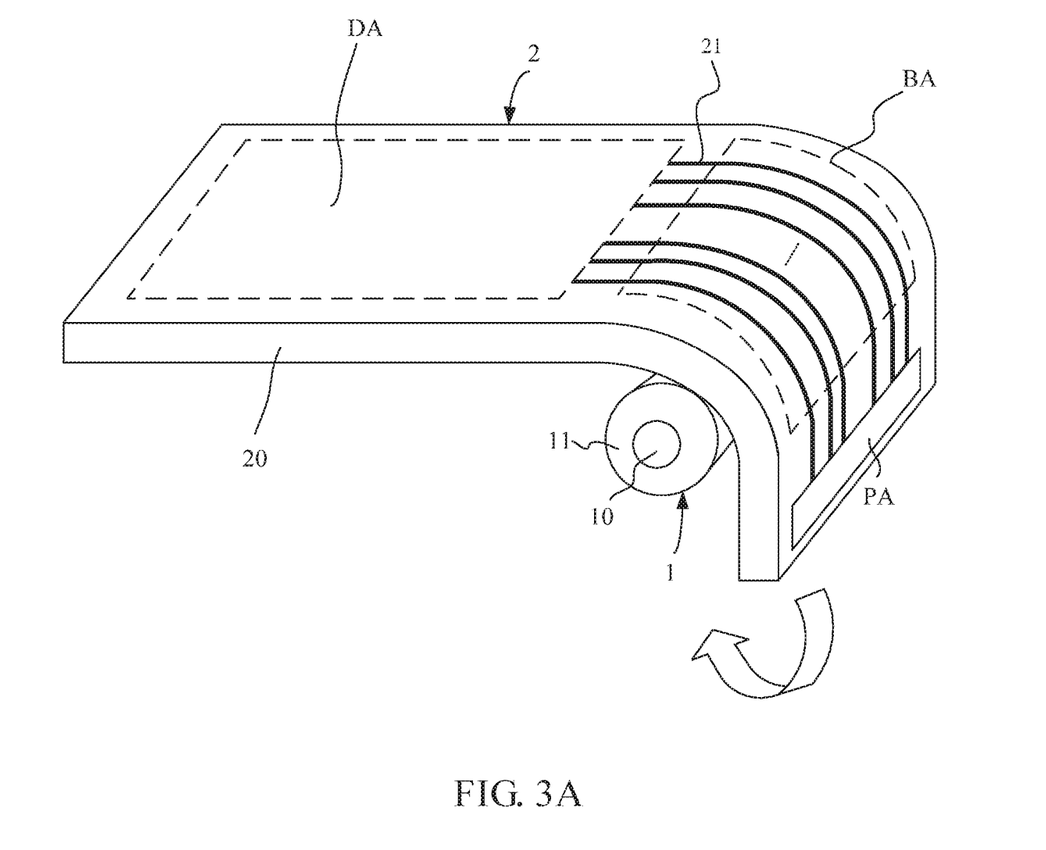
FIG. 3A is a cross-sectional view corresponding to steps S02-S04 applied in FIG. 2.
Figure 3B:
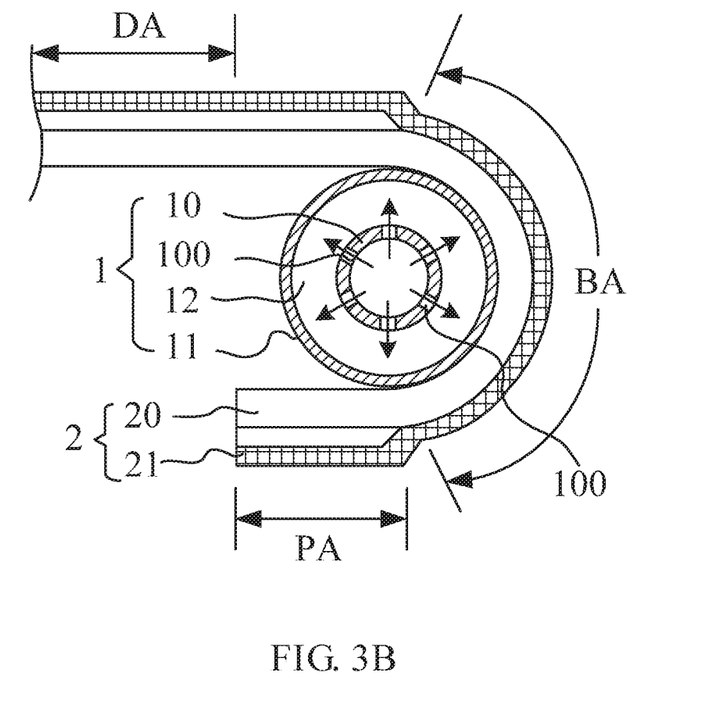
FIG. 3B is a cross-sectional view corresponding to step S04 applied in FIG. 2.
Figure 3C:
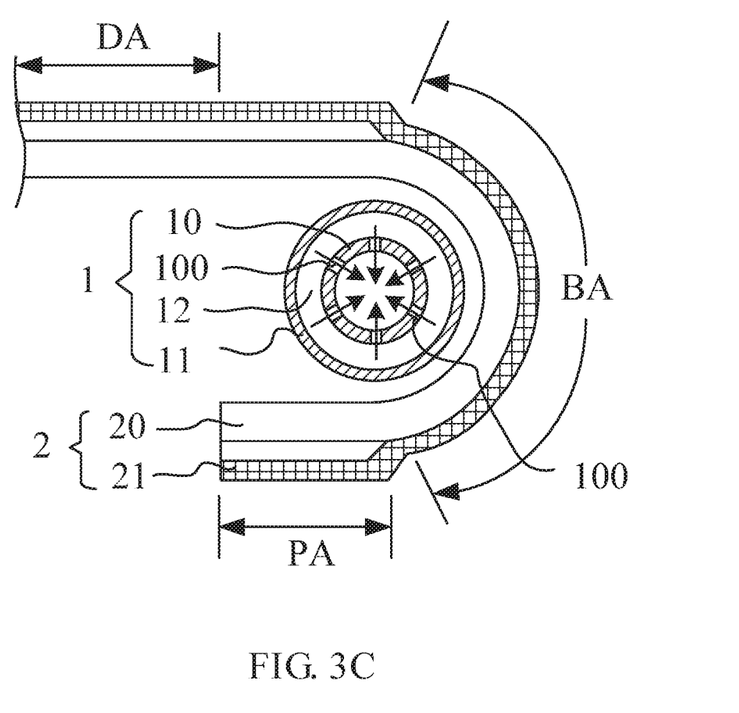
FIG. 3C is a cross-sectional view corresponding to step S05 applied in FIG. 2.

Also referring to FIGS. 3A-3C, wherein FIG. 3A is a cross-sectional view corresponding to steps S02-S04 applied in FIG. 2, wherein FIG. 3B is a cross-sectional view corresponding to step S04 applied in FIG. 2, and wherein FIG. 3C is a cross-sectional view corresponding to step S05 applied in FIG. 2. As shown in FIG. 3A, a flexible panel 2 includes a display area DA, a bending area BA, and a terminal area PA adjacent to the bending area BA. Specifically, the flexible panel 2 is an organic light-emitting diode display panel. Furthermore, the flexible panel 2 includes a flexible substrate 20, a plurality of metal signal lines 21 passing through the bending area BA, and bonding terminals (not shown) disposed in the terminal area PA. The metal signal lines 21 are electrically connected to the bonding terminals.

Continuing to refer to FIG. 2, the method for bending the flexible panel 2 includes the following steps:

Step S01: providing the airbag assembly 1 shown in FIG. 1.

Step S02: inflating the airbag assembly 1. In an embodiment of the present disclosure, as shown in FIG. 1, step S02 includes: first, controlling, by the controller 17, the pressure-adjusting valve 14 to be turned on. In FIG. 1, airflow shown by arrows continues flowing into the gas chamber 12; next, outputting, by the pressure sensor 13, a first signal when the pressure inside the gas chamber 12 increases to a predetermined value; and lastly, receiving, by the controller 17, the first signal and controlling, by the controller 17, the pressure-adjusting valve 14 to be turned off.

Step S03: abutting against the bending area BA with the airbag assembly 1 (as shown in FIG. 3A).

Step S04: as shown in FIGS. 3A and 3B, bending the flexible panel 2 by pivoting on the airbag assembly 1 so that a bent portion of the flexible panel 2 tightly contacts a surface of the airbag assembly 1, and the terminal area PA is located behind the flexible panel 2. FIG. 3B shows a cross-sectional view along line A-A of the airbag assembly 1 shown in FIG. 1. In FIG. 3B, the plurality of outlets 100 are arranged at an equal distance along the periphery of the housing 10. Further, airflow shown by arrows flows into the gas chamber 12 through the plurality of outlets 100 so that the elastic film 11 inflates evenly. While being bent, the flexible panel 2 abuts against the inflating elastic film 11. The flexible panel 2 is bent to a required curvature through applying a bending force to the flexible panel 2 on the inflating elastic film 11. The flexible panel 2 with different curvature can be formed by the elastic film 11 with different extent of inflation. Thus, the airbag assembly of the present disclosure is suitable for forming flexible panels with different shapes.

Step S05: causing the airbag assembly 1 to exhaust after the flexible panel 2 is bent. As shown in FIG. 1, step S05 includes: first, controlling, by the controller 17, the pressure-adjusting valve 14 to decompress; next, outputting, by the pressure sensor 13, a second signal when the pressure inside the gas chamber 12 decreases to a predetermined value; and lastly, receiving, by the controller 17, the second signal and controlling, by the controller 17, the pressure-adjusting valve 14 to stop decompressing. As shown in FIG. 3C, airflow shown by arrows continues flowing out of the gas chamber 12. When the airbag assembly 1 finishes exhausting, the airbag assembly 1 and the flexible panel 2 are separated without interfering with each other.

In conclusion, the present disclosure provides the airbag assembly and the method for bending a flexible panel mainly by providing the airbag assembly to support the bent portion of the flexible panel while the flexible panel is bent in order to avoid that the metal signal lines break due to stresses and to ensure that a display panel can display normally.

It should be understood that the application of the present disclosure is not limited by the foregoing examples. A person of ordinary skill in the art is able to make modifications or changes based on the foregoing description, and all of these modifications and changes are within the scope of the appended claims of the present disclosure.

The industrial applicability of the present disclosure is that, the airbag assembly is provided to support the bent portion of the flexible panel in order to avoid that the metal signal lines break due to stresses and to ensure that the display panel can display normally.

What is claimed is:

1. An airbag assembly, configured to bend a flexible panel, comprising:
   a housing comprising at least one outlet and at least one inlet;
   a rubber film wrapping a periphery of the housing, wherein the housing runs through the rubber film, the periphery of the housing is attached to a proximal end of the rubber film near the at least one inlet and a distal end of the rubber film away from the at least one inlet to form a gas chamber between the housing and the rubber film, the at least one outlet and the at least one inlet communicate with the gas chamber, and the gas chamber is inflatable to bend the flexible panel to a required curvature;
   a gas source;
   a gas pipeline communicating with the gas source and the at least one inlet of the housing;
   a pressure sensor disposed in the gas pipeline;
   a pressure-adjusting valve connected to the gas source and the housing through the gas pipeline; and
   a controller electrically connected to the pressure sensor and the pressure-adjusting valve and configured to receive an output signal from the pressure sensor and to control the pressure-adjusting valve to be turned on and off.

2. An airbag assembly, configured to bend a flexible panel, comprising:
   a housing comprising at least one outlet and at least one inlet; and
   an elastic film wrapping a periphery of the housing, wherein the housing runs through the elastic film, the periphery of the housing is attached to a proximal end of the elastic film near the at least one inlet and a distal end of the elastic film away from the at least one inlet to form a gas chamber between the housing and the rubber film, the at least one outlet and the at least one inlet communicate with the gas chamber, and the gas chamber is inflatable to bend the flexible panel to a required curvature.

3. The airbag assembly of claim 2, further comprising:
   a gas source;
   a gas pipeline communicating with the gas source and the at least one inlet of the housing;
   a pressure sensor disposed in the gas pipeline;
   a pressure-adjusting valve connected to the gas source and the housing through the gas pipeline; and
   a controller electrically connected to the pressure sensor and the pressure-adjusting valve and configured to receive an output signal from the pressure sensor and to control the pressure-adjusting valve to be turned on and off.

4. The airbag assembly of claim 2, wherein the elastic film is a rubber film.

5. The airbag assembly of claim 2, wherein the at least one outlet is linearly arranged on the periphery of the housing at an equal distance to guide airflow into the gas chamber.

6. A method for bending a flexible panel comprising a bending area and a terminal area adjacent to the bending area, the method comprising:
   providing an airbag assembly, wherein the airbag assembly comprises a housing comprising at least one outlet and at least one inlet, and an elastic film wrapping a periphery of the housing, the housing runs through the elastic film, the periphery of the housing is attached to a proximal end of the elastic film near the at least one inlet and a distal end of the elastic film away from the at least one inlet to form a gas chamber between the housing and the rubber film, the at least one outlet and the at least one inlet communicate with the gas chamber, and the gas chamber is inflatable to bend the flexible panel to a required curvature;
   inflating the airbag assembly;
   abutting against the bending area with the airbag assembly; and
   bending the flexible panel by pivoting on the airbag assembly so that a bent portion of the flexible panel tightly contacts a surface of the airbag assembly, and the terminal area is located behind the flexible panel.

7. The method of claim 6, wherein the airbag assembly further comprises:
   a gas source;
   a gas pipeline communicating with the gas source and the at least one inlet of the housing;
   a pressure sensor disposed in the gas pipeline;
   a pressure-adjusting valve connected to the gas source and the housing through the gas pipeline; and
   a controller electrically connected to the pressure sensor and the pressure-adjusting valve and configured to receive an output signal from the pressure sensor and to control the pressure-adjusting valve to be turned on and off.

8. The method of claim 7, wherein the step of inflating the airbag assembly comprises:
   controlling, by the controller, the pressure-adjusting valve to be turned on;
   outputting, by the pressure sensor, a first signal when the pressure inside the gas chamber increases to a predetermined value; and
   receiving, by the controller, the first signal and controlling, by the controller, the pressure-adjusting valve to be turned off.

9. The method of claim 7, further comprising: causing the airbag assembly to exhaust after the flexible panel is bent.

10. The method of claim 9, wherein the step of causing the airbag assembly to exhaust comprises:
    controlling, by the controller, the pressure-adjusting valve to decompress;

outputting, by the pressure sensor, a second signal when the pressure inside the gas chamber decreases to a predetermined value; and receiving, by the controller, the second signal and controlling, by the controller, the pressure-adjusting valve to stop decompressing.

11. The method of claim 6, wherein the flexible panel comprises bonding terminals disposed in the terminal area.

12. The method of claim 6, wherein the flexible panel comprises a plurality of metal signal lines passing through the bending area.

* * * * *